(12) United States Patent
Prinz et al.

(10) Patent No.: US 6,853,164 B1
(45) Date of Patent: Feb. 8, 2005

(54) BANDGAP REFERENCE CIRCUIT

(75) Inventors: Francois X. Prinz, San Jose, CA (US); Ovidiu Aioanei, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/143,065

(22) Filed: May 9, 2002

Related U.S. Application Data
(60) Provisional application No. 60/377,275, filed on Apr. 30, 2002.

(51) Int. Cl.[7] .............................................. H01M 10/46
(52) U.S. Cl. ....................................... 320/119; 320/121
(58) Field of Search ................................ 323/313, 314, 323/315, 316

(56) References Cited

U.S. PATENT DOCUMENTS

| | | | |
|---|---|---|---|
| 3,617,859 A | | 11/1971 | Dobkin et al. |
| 3,887,863 A | | 6/1975 | Brokaw |
| 4,383,188 A | * | 5/1983 | Crosby ........................ 341/136 |
| 4,433,283 A | * | 2/1984 | Gersbach ..................... 323/314 |
| 4,525,663 A | * | 6/1985 | Henry ......................... 323/280 |
| 4,595,874 A | * | 6/1986 | Hein et al. ................... 323/312 |
| 4,780,624 A | * | 10/1988 | Nicollini et al. ............. 327/541 |
| 4,906,863 A | * | 3/1990 | Van Tran ..................... 327/539 |
| 5,087,830 A | * | 2/1992 | Cave et al. .................. 327/539 |

\* cited by examiner

*Primary Examiner*—Bao Q. Vu
(74) *Attorney, Agent, or Firm*—Sidley Austin Brown & Wood LLP

(57) ABSTRACT

A bandgap reference circuit and method of using the same are provided. The bandgap reference circuit may provide start-up requirements at substantially any voltage and at substantially any temperature. The circuit comprises an op amp (two stages of transistors) and a network of resistors and bipolar diodes. When an artificial offset of about −5 mV is introduced to the op amp, the op amp output will be high as soon as the power supply exceeds the transistors' threshold voltages. The op amp output supplies the resistor and diode network and brings the op amp inputs within desired regulation voltages.

16 Claims, 6 Drawing Sheets

US 6,853,164 B1

BANDGAP REFERENCE CIRCUIT

CLAIM OF PRIORITY

The present application claims priority to co-assigned U.S. Provisional Patent Application entitled "BANDGAP REFERENCE CIRCUIT," 60/377,275 which was filed on Apr. 30, 2002.

BACKGROUND OF THE INVENTION

1. Field of the Invention

The present invention relates to circuits, and in particular to bandgap reference circuits.

2. Description of the Related Art

Ideally, a bandgap reference circuit is intended to provide a substantially temperature-invariant reference voltage level to other circuits over a range of temperatures. The bandgap reference circuit is an electrical loop that needs a means of starting the circuit, such as a start-up circuit. Most of the time, the means of starting the bandgap reference circuit can consume current (i.e., drain power) and, in some cases, be a source of oscillation or instability.

A "positive offset" is defined as an output of an operational amplifier (op amp) being relatively low when the differential pair inputs of the op amp are connected to substantially the same voltage. Conversely, a "negative offset" causes the op amp output to be at a relatively high level. A "systematic offset" is an offset introduced by a design principle. A "spread offset" is an offset introduced by processing. An "artificial offset" is an offset introduced willingly by the designer.

SUMMARY OF THE INVENTION

In accordance with the present invention, a self-starting bandgap reference circuit is provided. "Self-starting" is related to two main factors: an op amp with a negative offset regardless of conditions of an application and a stable bias current generated by an input voltage. One embodiment of the bandgap (BG) reference circuit provides start-up requirements at substantially any voltage and at substantially any temperature. In a simple BG configuration comprising a balanced op amp (e.g., two stages of transistors) and a network of resistors and bipolar diodes, the well-balanced op amp output remains in low mode since its offset is about +1 mV by design (systematic offset). With a low output, the op amp is not able to supply the network of resistors and diodes, and thus the bandgap reference circuit remains inert.

If an artificial offset of about −5 mV is introduced to the [+] branch/terminal of the op amp, then the op amp output will be high as soon as the power supply exceeds the transistors' threshold levels. The op amp output supplies the resistors and diodes network and brings the op amp inputs within desired regulation voltages.

One embodiment of the invention relates to a practical, relatively simple bandgap (BG) reference circuit with complementary metal oxide semiconductor (CMOS) transistors or bipolar transistors. The BG reference circuit advantageously provides moderate accuracy and low power consumption in a wide range of temperatures and input voltages. The BG reference circuit provides better stability and a low cost production yield. In one configuration, the BG reference circuit specifications include a maximum +/−6 mV voltage change in a temperature range of −40° C. to +125° C. and between about 2-V to 8-V power supply. This means that the bandgap voltage (BG)=1.240V +/−6 mV.

The bandgap reference circuits and methods described herein may be implemented in several products or applications without any adverse effects. One advantage of the circuits and methods is their relative simplicity. In one embodiment, a two-stage op amp may be used, and no starting loop is necessary. The risk of oscillation is strongly reduced, and the power supply current is reduced as well.

One aspect of the invention relates to a circuit comprising an operational amplifier (op amp) connected such that voltage levels at input terminals of the op amp are unbalanced, and an output voltage of the op amp is always high during a start-up period.

Another aspect of the invention relates to a voltage regulator configured to generate a bias current to a bias input line of an operational amplifier (op amp). The voltage regulator comprises a first transistor, a second transistor, a first resistor, a second resistor, a third transistor, a third resistor and a fourth resistor. The first transistor and second transistor are in series, where the first transistor is coupled to an input voltage line (VIN). The first resistor is coupled between the second transistor and a second resistor, where the first resistor has a negative thermal coefficient. The second resistor is coupled between the first resistor and a ground line, where the second resistor has a positive thermal coefficient. The third transistor is coupled to the input voltage line (VIN) and the bias current line. The third and fourth resistors are in series coupled between the bias current line and the second transistor, where the third and fourth resistors have different thermal coefficients.

Another aspect of the invention relates to a device comprising a self-starting bandgap reference circuit. The bandgap reference circuit comprises an unbalanced operational amplifier (op amp), a first resistor, a diode, a second resistor, a third resistor and a set of diodes. The op amp comprises a positive input line, a negative input line, and an output line. The op amp is configured to output a bandgap reference voltage of about 1.240 volts +/−about 6 millivolts between about −40 degrees and at least about +125 degrees. Celsius. The first resistor and the diode are coupled to the positive input line of the op amp. The second resistor and the third resistor are coupled to the negative input line of the op amp. The diodes in the set of diodes are in parallel and coupled to the third resistor.

Another aspect of the invention relates to an unbalanced operational amplifier (op amp) circuit configured to supply a voltage to a network of resistors and diodes such that the op amp, resistors and diodes provide a bandgap reference voltage of about 1.240 volts +/−about 6 millivolts between about −40 degrees and at least about +125 degrees. Celsius. The op amp comprises seven transistors. A first transistor is coupled to an input voltage line (VIN) and a bias current line. A second transistor is coupled to the input voltage line (VIN), the bias current line and an output line. A third transistor is coupled to the first transistor and the negative input line. A fourth transistor is coupled to the positive input line and the first transistor. A fifth transistor is coupled to the third transistor and a common voltage line. A sixth transistor is coupled to the fourth transistor, the fifth transistor and the common voltage line. A seventh transistor is coupled to the output line, the fourth transistor and the common voltage line.

Another aspect of the invention relates to a method of generating a bandgap reference voltage. The method comprises introducing a negative offset to an op amp in a bandgap reference circuit, and applying an input voltage to the op amp.

DETAILED DESCRIPTION

Figure 1:
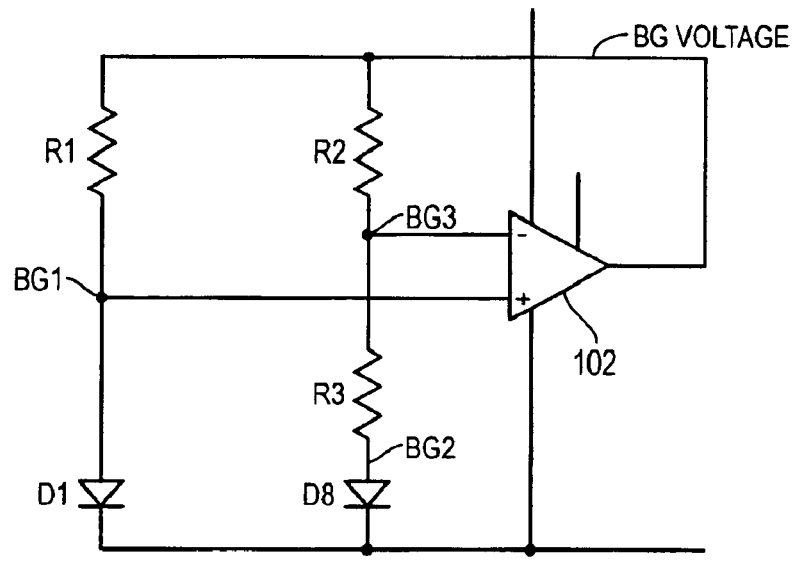
FIG. 1 illustrates one embodiment of a bandgap (BG) reference circuit.
Figure 1:

FIG. 1 illustrates one embodiment of a bandgap (BG) reference circuit 100. The circuit 100 comprises a resistor R1, a first bandgap node (or test point) BG1, a first diode D1, another resistor R2, a third bandgap node BG3, another resistor R3, a second bandgap node BG2, a set of diodes D8 in parallel, an amplifier 102, such as an operational amplifier, and a bandgap voltage BG line/node/test point. The circuit 100 may comprise other components in addition to or instead of the components shown in FIG. 1.

In one embodiment, the diodes D1, D8 are identical bipolar diodes. The set of diodes labeled "D8" may comprise eight diodes in parallel. In other embodiments, less than eight or more than eight diodes may be used in the set labeled as "D8." The difference in voltage between the forward-biased diode D1 (voltage at BG1) and the set of diodes D8 in parallel (voltage at BG2), may be represented as dV:

$$dV = BG1 - BG2$$

The dV value may increase with a rising temperature, while the BG1 and BG2 values decrease.

When dV is amplified conveniently and added to the voltage drop of the single diode at BG1, the circuit 100 will generate a bandgap voltage VBG of about 1.240 V and exhibit good temperature stability.

$$VBG = BG1 + ((dV)R2/R3)\ 1.240\ V$$

Amplifier

Various types of amplifiers and circuit configurations may be used for the amplifier 102 in FIG. 1. In one embodiment, the amplifier 102 is a very basic two-stage operational amplifier (op amp)(with a. Miller feedback capacitor) that reduces the risk of oscillation.

Figure 2:
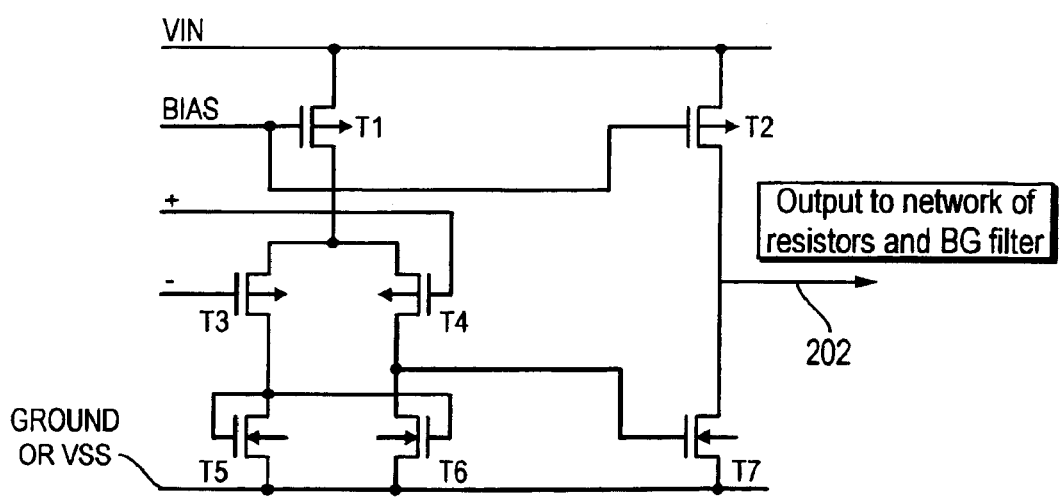
FIG. 2 illustrates one embodiment of a two-stage op amp that may be used as the amplifier in FIG. 1.
Figure 2:

FIG. 2 illustrates one embodiment of a two-stage op amp 200 that reduces the risk of oscillation, which may be used as the amplifier 102 in FIG. 1. The op amp 200 comprises an input voltage line VIN, a bias voltage line BIAS, a positive voltage input line labeled as "+," a negative voltage input line labeled as "−" a line coupled to ground or. $V_{SS}$, a plurality of transistors T1–T7, and an output line 202 coupled to a network of resistors, such as the resistors in FIG. 1. The BG voltage in FIG. 1 may be measured at the output line 202. The input and output "lines" described herein may also be referred to as "terminals." The op amp 200 may be analyzed as a first stage (input stage) comprising transistors T1, T3, T4, T5, T6 and a second stage (output stage) comprising transistors T2 and T7.

When the op amp 200 is well balanced, i.e., the current densities in T5, T6, T7 are the same, and T3–T4 are approximately the same size physically, the op amp 200 presents a positive systematic offset of about +1 mV. In other words, if the differential pair T3 and T4 is connected to ground or the same voltage, the output at the output line 202 is low. When power is applied to the circuit 100, the diodes D1 D8 and the resistors R1, R2, R3 (FIG. 1) cannot be supplied by the low output of the op amp 200 due to the positive systematic offset, and the bandgap reference circuit 100 remains inert.

Offset

In addition to the systematic (+1 mV) offset, a spread offset (+/−3 mV) may also be present due mainly to the transistors' differential pair matching.

Figure 3:
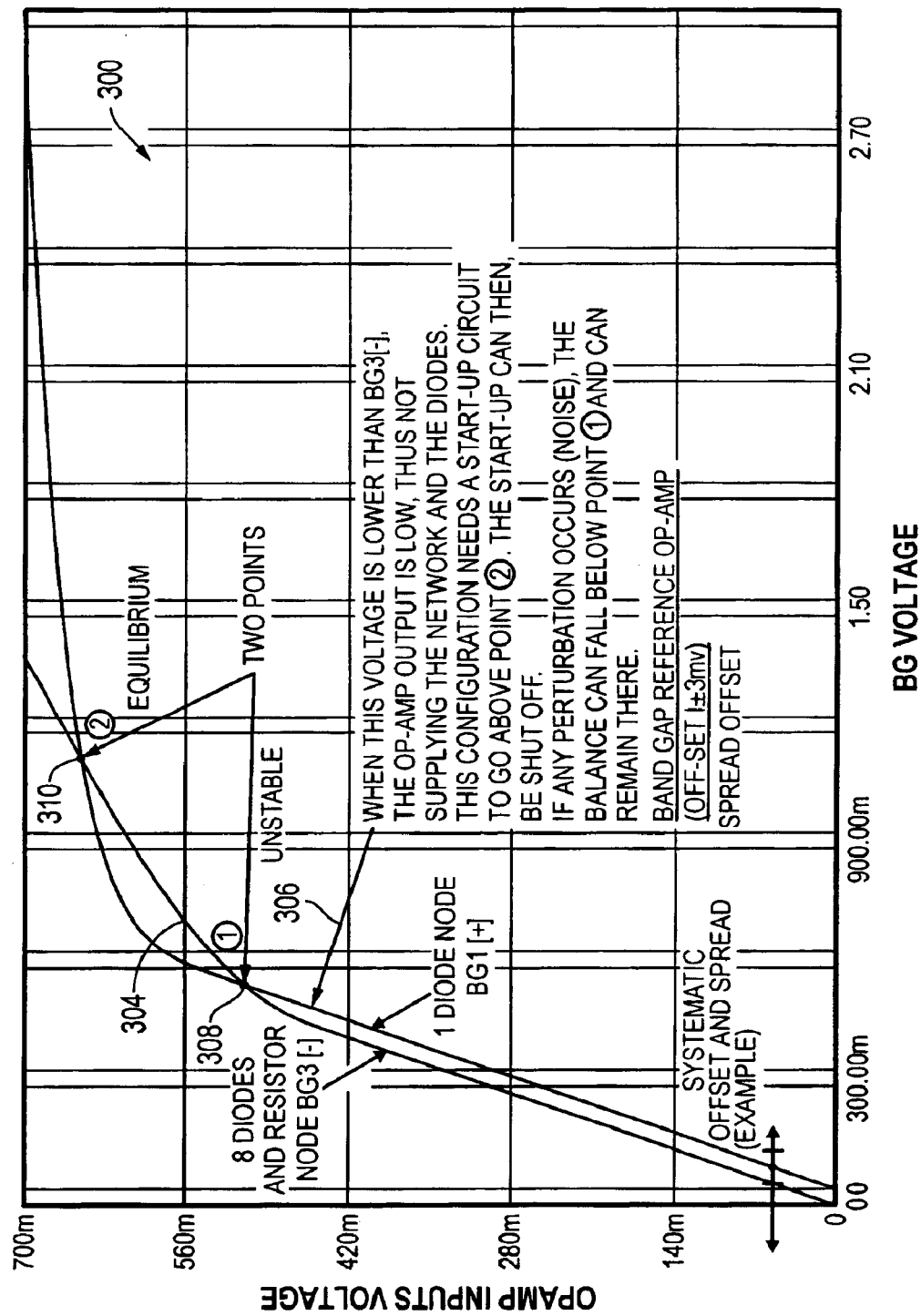
FIGS. 3 & 4 illustrate examples of graphs of diode voltages measured at points BG1 and BG3 versus BG voltage in FIG. 1.
Figure 4:
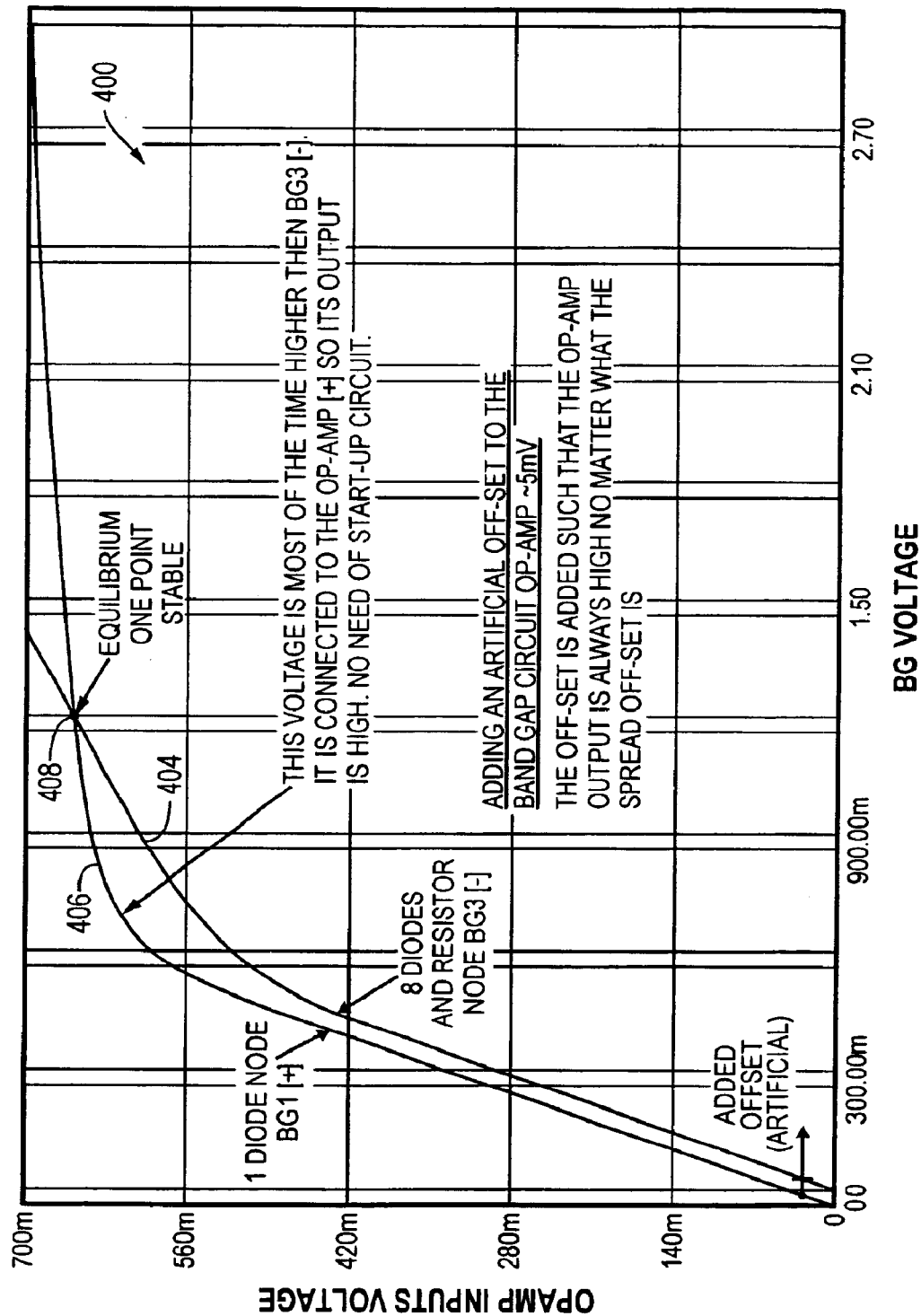

FIGS. 3 & 4 illustrate examples of graphs 300, 400 of diode voltages measured at points BG1 and BG3 (y-axis) versus BG voltage (x-axis) in FIG. 1. A BG1 curve 306 in FIG. 3 represents the voltage drop across the diode D1 in FIG. 1. A BG3 curve 304 in FIG. 3 represents the voltage drop across the eight diodes D8 and the resistor R3 in FIG. 1.

FIG. 3 illustrates bandgap reference op amp voltages with an offset of about +/−3 mV, for example. FIG. 3 illustrates a point 308, which may represent an unstable condition, and a point 310, which may represent an equilibrium condition. When BG1 voltage 306 is lower than BG3 304 ("−"terminal), the op amp output is low and thus not supplying the resistor network and the diodes in FIG. 1. This configuration needs a start-up circuit to go above point 310. The start-up circuit can then be shut off. If any perturbation (noise) occurs, the balance can fall below point 308 and can remain there.

FIG. 4 illustrates that if a negative artificial offset of about 5 mV is artificially introduced in the "+" branch of the op amp 200 (FIG. 2), the BG output 11 voltage (FIG. 4) at line 202 in FIG. 2 will be high for any condition of an application, until the BG3 curve 404 crosses the BG1 curve 406 in FIG. 4, which is labeled as point 408. This occurs when the voltage drop in the resistor R3 is approximately equal to dV plus the offsets. The total offset (toffset) may be expressed as the sum of systematic offset +spread offset +artificial offset. At point 408 (i.e., equilibrium point), the op amp output line 202 in FIG. 2 is stable at a BG voltage, such as 1.240V. The artificial offset is added such that the op amp output is always high no matter what the spread offset is.

In FIG. 4, the BG1 voltage 406 may be higher than the BG3 voltage 404 most of the time. The BG1 voltage 406 is applied to the "+" terminal of the op amp 200 so the output is high. There is no need for a startup circuit.

Several solutions are proposed to realize this artificial offset. For example, one method proposes changing the current density of the output stage (transistor T7). Another method proposes changing the current density of transistor T6. Finally, one simple method is to unbalance the differential pair T3 and T4. For example, reducing the gate width of the positive input transistor T4 by about 8% will introduce a negative offset of approximately 5 mV. With a total offset (toffset), the BG voltage may be expressed as:

$$VBG = BG1 + (R2/R3(dV + (toffset)))\ (R2/R3\ \text{is called the gain})$$

In order to ensure a 100% functionality, the artificial offset should be larger than the systematic and spread offsets added, e.g., in the worst case: toffset=((+1+3)−5)=−1 mV, and the BG circuit 100 still starts. Thus, in one embodiment, the gate width of transistor T4 is reduced by about 8%. In another embodiment, the gate width of transistor T3 is increased by about 8%. In either case, the final result is the same.

Bias

In order to reduce input voltage dependence and increase the ripple rejection factor, a bandgap reference circuit may use a stable output voltage regulator, switcher or some other device to supply its own BG op amp, which in turn may create its own bias current. This configuration may be an attractive solution, but it may introduce several loops such that extreme care must be taken not to generate any oscillation or a pseudo stable state. Most of the time, the complexity of this solution and the loss of production yield associated with it will cancel the advantages.

One method of generating a bias current for the BIAS line in FIG. 2 uses a simple voltage regulator (see FIG. 5) that is compensated for temperature and input voltage.

Figure 5:
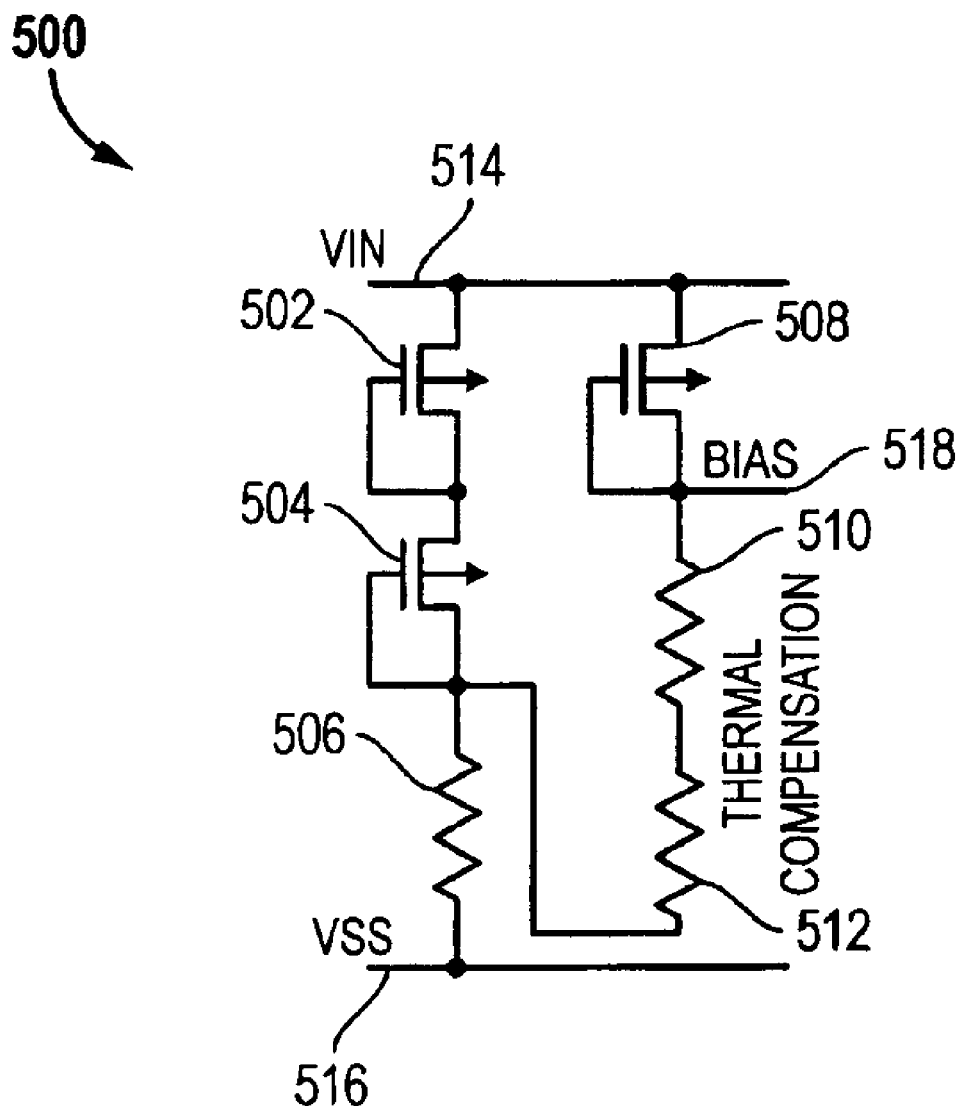
FIG. 5 illustrates one embodiment of a voltage regulator that may be coupled to the BIAS line of the op amp in FIG. 2.

FIG. 5 illustrates one embodiment of a voltage regulator 500 that may be coupled to the BIAS line of the op amp 200 in FIG. 2. The voltage regulator 500 comprises a input voltage VIN line 514, a ground or VSS line 516, a plurality of transistors 502, 504, 508, a plurality of resistors 506, 510, 512 and a BIAS output line 518.

By appropriately selecting the resistors 506, 510, 512 and thermal coefficients (tempcos) for each resistor, a +/-30% bias current can be generated on BIAS line 518 in the whole range of temperatures, e.g., about −40 to +125° C., and input voltages, e.g., about 2 to 8 V. In FIG. 5, the value of the resistors 506, 510, 512 (see FIG. 7 described below) and "tempcos" have been selected to compensate for the transistors' threshold voltage $V_{TH}$ change in temperature and to generate an acceptable bias current.

Trimming

The bandgap can be easily trimmed by introducing additional resistors (see FIG. 6 described below) in the diodes part of the circuit 100 (FIG. 1) to reduce the current in D1 or D8, which in turn reduces or increases dV. The trimming resistors may be activated by fuses, laser or electrically opened, or transistors controlled by a memory.

For example, increasing the total value of R1 will reduce BG1 and thus dV, so the resultant BG will decrease. Conversely, increasing the value of R2 will decrease BG2 and thus increase dV, and the gain, the resultant BG, will increase.

Application

Figure 6:
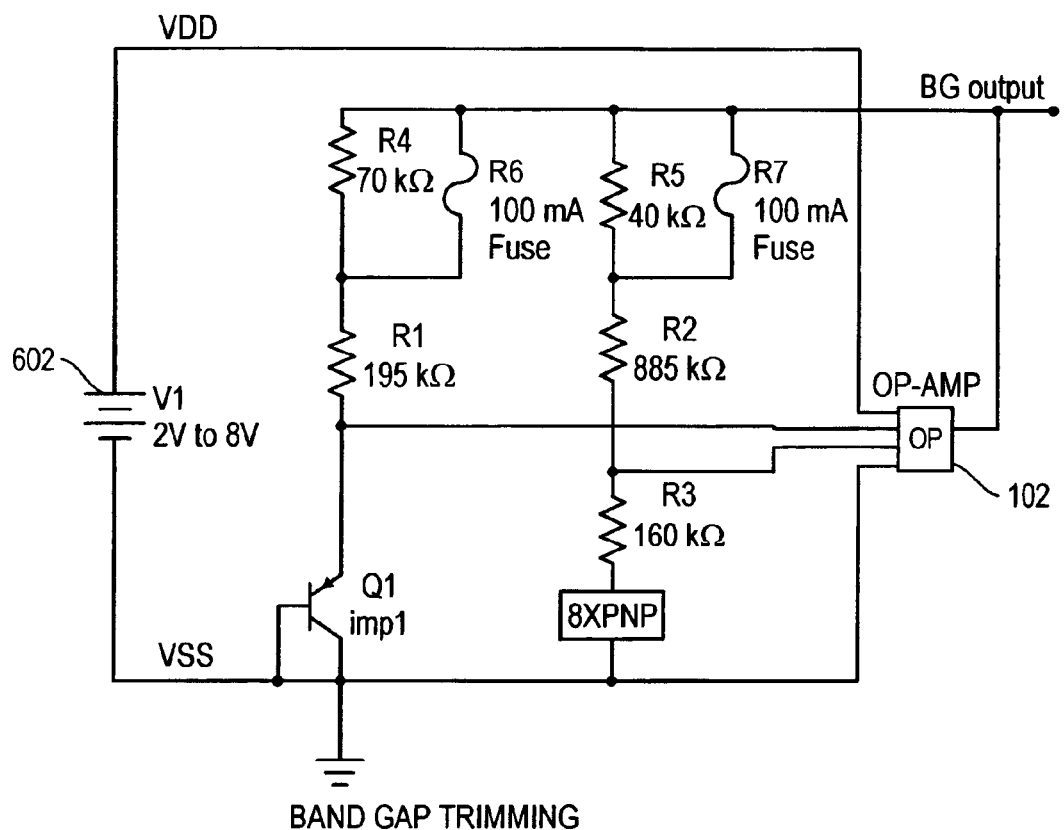
FIG. 6 illustrates one embodiment of the bandgap reference circuit in FIG. 1 with examples of voltage and resistance values.

FIG. 6 illustrates one embodiment of the bandgap reference circuit 100 in FIG. 1 with examples of voltage and resistance values. In FIG. 6;

R1=195 kohms R2=885 kohms R3=160 kohms, gain= 5.531

BG1=679.2 mV, BG2=582.8 mV, dV=BG1+BG2+toffset=96.4+5=101.4 mV

BG=(679.2+(101.4×5.531))=1.240 V.

In FIG. 6, a VIN voltage supply 602 of 3 volts may be supplied to the op amp 102, but other voltage levels may be provided, such as 5 V. The bandgap reference circuit 100 in FIG. 1 is not limited to the values shown in FIG. 6 and may have other resistance values and voltage levels.

Figure 7:
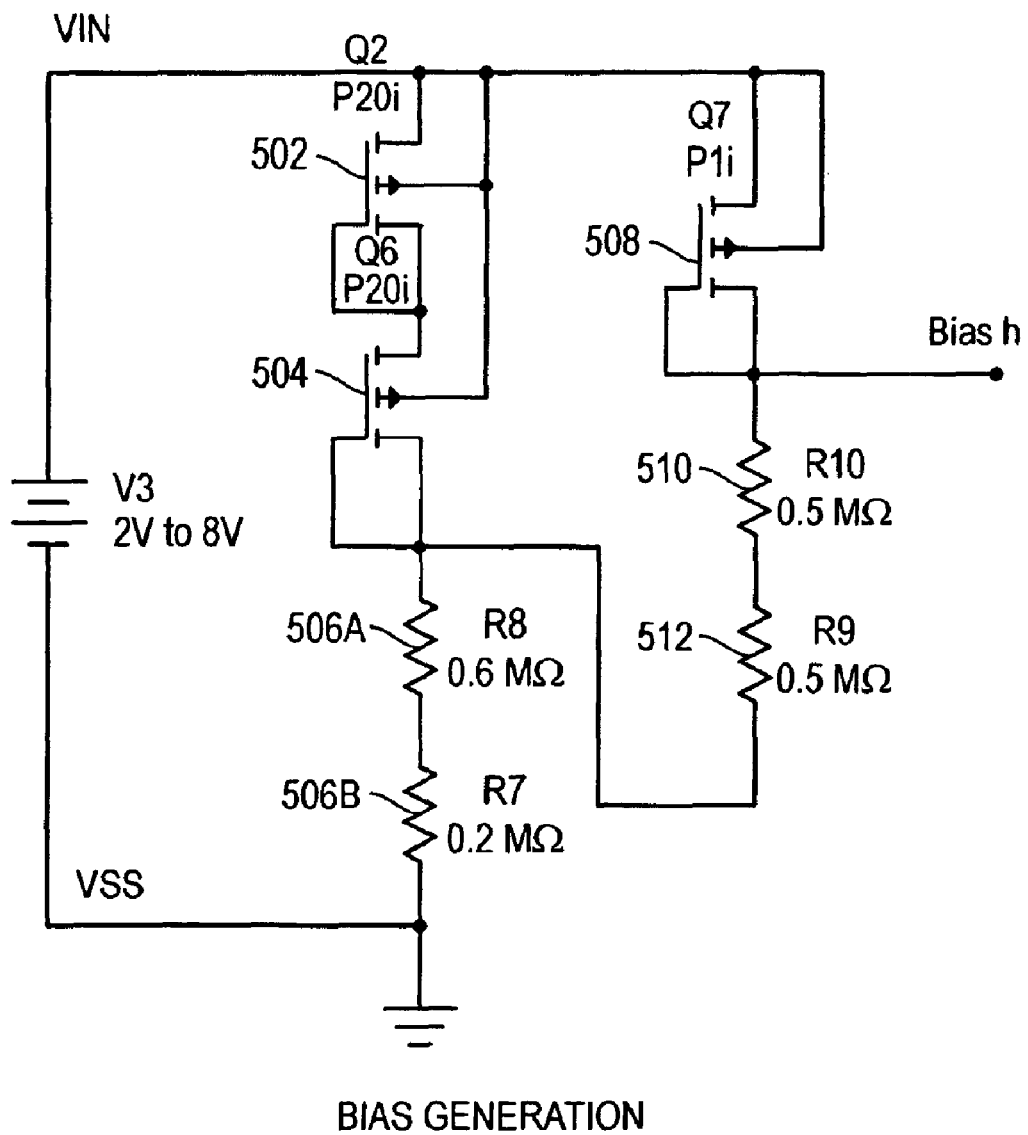
FIG. 7 illustrates one embodiment of the voltage regulator in FIG. 5 with examples of voltage, current and resistance values.

FIG. 7 illustrates one embodiment of the bias circuit or voltage regulator of FIG. 5 with examples of voltage, current and resistance values. In FIG. 7, resistor 506A has a resistance of 0.6 Mohms, resistor 506B has a resistance of 0.2 Mohms, resistor 510 has a resistance of 0.5 Mohms, and resistor 512 has a resistance of 0.5 Mohms. The "tempcos" of these resistors 506A, 506B, 510, 512 have been chosen to compensate for the temperature drift.

For example, the tempco for "P-" type resistors is about +0.0028 per degree. Celsius, and the tempco for high resistance polysilicon (HRPoly) resistors is about −0.0036 per degree. Celsius. Thus, a 180-kohm P-resistor at 25 degrees. Celsius will be 230 kohm at 125 degrees. Celsius (125−25=100 degree change; 100×0.0028=0.28; 0.28×180= 50.4 kohms; 50+180=230 kohms). A-140 kohm HRPoly resistor at 25 degrees. Celsius will be 90 kohm at 125 degrees. Celsius. If these two resistors are in series, the total resistance will be 320 kohm at 25 degrees. Celsius and will be 320 kohm at 125 degrees. Celsius. In combining these values, the bias circuit can compensate various parameters for temperature drift.

The circuits and methods described above may be implemented in several products without any adverse effects. One advantage of the circuits and methods is their relative simplicity. A two-stage op amp may be used and no starting loop is necessary. The risk of oscillation may be totally suppressed. The bias may be directly generated by the input voltage VIN, and no fancy secondary loops are needed. The rejection factor may not be as good as for more sophisticated circuits, but using an RC filter after the BG (e.g., 2.5 Mohms and 20 pF), the circuit 100 may enable >60 dB rejection at 10 kHz.

The above-described embodiments of the present invention are merely meant to be illustrative and not limiting. Various changes and modifications may be made without departing from the invention in its broader aspects. The appended claims encompass such changes and modifications within the spirit and scope of the invention.

What is claimed is:

1. A circuit comprising an operational amplifier (op amp) connected such that voltage levels at input terminals of the on amp are unbalanced and an output voltage of the op amp is always high during a start-up period, the on amp using no start-up circuit, wherein the op amp comprises:

a first transistor coupled to an input voltage line (VIN) and a bias current line;

a second transistor coupled to the input voltage line (VIN), the bias current line and an output line;

a third transistor coupled to the first transistor and a negative input line;

a fourth transistor coupled to a positive input line and the first transistor, the gate width of the third transistor being about 8% larger than the gate width of the fourth transistor to introduce a negative offset in the op amp;

a fifth transistor coupled to the third transistor and a common voltage line;

a sixth transistor coupled to the fourth transistor, the fifth transistor and the common voltage line; and a seventh transistor coupled to the output line, the fourth transistor and the common voltage line.

2. A circuit comprising an operational amplifier (op amp) connected such that voltage levels at input terminals of the op amp are unbalanced and an output voltage of the op amp is always high during a start-up period, the op amp using no start-up circuit, wherein the op amp comprises;

a first transistor coupled to an input voltage line (VIN) and a bias current line;

a second transistor coupled to the input voltage line (VIN), the bias current line and an output line;

a third transistor coupled to the first transistor and a negative input line;

a fourth transistor coupled to a positive input line and the first transistor, the gate width of the fourth transistor is about 8% smaller than the gate width of the third transistor to introduce a negative offset in the op amp;

a fifth transistor coupled to the third transistor and a common voltage line;

a sixth transistor coupled to the fourth transistor, the fifth transistor and the common voltage line; and a seventh transistor coupled to the output line, the fourth transistor and the common voltage line.

3. A circuit comprising an operational amplifier (op amp) connected such that voltage levels at input terminals of the op amp are unbalanced and an output voltage of the op amp is always high during a start-up period, the op amp using no start-up circuit, wherein the sum of a systematic offset, a spread offset and an artificial offset of the op amp is about −1 mV to about −7 mV.

4. A circuit comprising an operational amplifier (op amp) connected such that voltage levels at input terminals of the op amp are unbalanced and an output voltage of the op amp is always high during a start-up period, the op amp using no start-up circuit, wherein the op amp is configured to output a bandgap reference voltage of about 1.24 volts +/−about 6 millivolts between about −40 degrees and about +125 degrees Celsius.

5. A voltage regulator configured to generate a bias current to a bias input line of an operational amplifier (op amp), the voltage regulator comprising:
- a first transistor and a second transistor in series, the first transistor being coupled to an input voltage line (VIN);
- a first resistor coupled between the second transistor and a second resistor, the first resistor having a negative thermal coefficient;
- a second resistor coupled between the first resistor and a ground line, the second resistor having a positive thermal coefficient;
- a third transistor coupled to the input voltage line (VIN) and the bias current line; and
- third and fourth resistors in series coupled between the bias current line and the second transistor, the third and fourth resistors having different thermal coefficients.

6. The circuit of claim 5, wherein the voltage regulator is configured to limit a change in the bias current to about +/−30% for a temperature range between about −40 degrees and at least about +125 degrees Celsius.

7. The circuit of claim 5, wherein the voltage regulator is configured to compensate for a change in threshold voltages of transistors.

8. A device comprising a self starting bandgap reference circuit, the bandgap reference circuit comprising:
- an unbalanced operational amplifier (op amp) comprising a positive input line, a negative input line, and an output line, the op amp being configured to output a bandgap reference voltage of about 1.240 volts +/−about 6 millivolts between about −40 degrees and at least about +125 degrees Celsius;
- a first resistor and a diode coupled to the positive input line of the op amp;
- a second resistor and a third resistor coupled to the negative input line of the op amp; and
- a set of diodes in parallel coupled to the third resistor.

9. An unbalanced operational amplifier (op amp) circuit configured to supply a voltage to a network of resistors and diodes such that the op amp, resistors and diodes provide a bandgap reference voltage of about 1.240 volts +/− about 6 millivolts between about −40 degrees and at least about +125 degrees Celsius, the op amp comprising:
- a first transistor coupled to an input voltage line (VIN) and a bias current line;
- a second transistor coupled to the input voltage line (VIN), the bias current line and an output line;
- a third transistor coupled to the first transistor and the negative input line;
- a fourth transistor coupled to the positive input line and the first transistor;
- a fifth transistor coupled to the third transistor and a common voltage line;
- a sixth transistor coupled to the fourth transistor, the fifth transistor and the common voltage line; and
- a seventh transistor coupled to the output line, the fourth transistor and the common voltage line.

10. A method of generating a bandgap reference voltage, the method comprising:
- introducing a negative offset to an op amp in a bandgap reference circuit; and
- applying an input voltage to the op amp, the op amp using no start-up circuit, wherein the op amp is structurally imbalanced.

11. A circuit comprising an operational amplifier (op amp) connected such that voltage levels at input terminals of the op amp are unbalanced and an output voltage of the op amp is always high during a start-up period, the op amp using no start-up circuit, wherein the op amp is structurally imbalanced.

12. The op amp of claim 11, wherein the structurally imbalanced op amp has two input transistors, the input transistors having appreciably different physical parameters.

13. The op amp of claim 12, wherein the physical parameters comprise a width of a transistor semiconductor layer, a length of a transistor semiconductor layer and a doping level of a transistor semiconductor layer.

14. The op amp of claim 13, wherein the transistor semiconductor layer is one of a source, a drain, an emitter, a collector and a gate.

15. The op amp of claim 13, wherein the appreciable difference of the physical parameters of the two input transistors comprises a relative difference of between 5 and 100 percent.

16. The op amp of claim 13, wherein the appreciable difference of the physical parameters of the two input transistors comprises a relative difference of between 5 and 15 percent.

* * * * *